United States Patent [19]

Yamamoto et al.

[11] Patent Number: 5,469,152
[45] Date of Patent: Nov. 21, 1995

[54] REMOTE CONTROL DEVICE THAT TRANSMITS SIGNALS INDICATING TERMINATION OF KEY PRESSING OPERATIONS

[75] Inventors: Hirotaka Yamamoto; Tamiya Tanaka, both of Kanagawa, Japan

[73] Assignee: Sony Corporation, Tokyo, Japan

[21] Appl. No.: 271,277

[22] Filed: Jul. 6, 1994

Related U.S. Application Data

[63] Continuation of Ser. No. 885,085, May 18, 1992, abandoned.

[30] Foreign Application Priority Data

May 20, 1991 [JP] Japan ...................................... 3-143870

[51] Int. Cl.⁶ ............................... H04Q 9/14; H04Q 7/00
[52] U.S. Cl. ............................ 340/825.63; 340/825.69; 340/825.24; 341/176; 359/148
[58] Field of Search ........................ 340/825.24, 825.25, 340/825.57, 825.69, 825.72, 825.63; 358/194.1, 86, 335; 360/14.1, 33.1; 369/24, 50; 359/148; 341/176

[56] References Cited

U.S. PATENT DOCUMENTS

| | | | |
|---|---|---|---|
| 4,202,038 | 5/1980 | Petersson | 341/23 |
| 4,459,591 | 7/1984 | Haubner et al. | 340/825.57 |
| 4,514,732 | 4/1985 | Hayes, Jr. | 340/825.57 |
| 4,663,626 | 5/1987 | Smith | 340/825.57 |
| 4,712,105 | 12/1987 | Köhler | 340/825.69 |
| 4,818,920 | 4/1989 | Jacob | 318/16 |
| 5,055,937 | 10/1991 | Yamada et al. | 360/14.1 |

FOREIGN PATENT DOCUMENTS

| | | | |
|---|---|---|---|
| 2533380 | 9/1982 | France | H03J 1/00 |
| 3404976 | 7/1985 | Germany | G05G 1/02 |

OTHER PUBLICATIONS

Patent Abstracts of Japan, Pub.#JP60001916, Pub. Jan. 8, 1985, Sony KK, European Patent Office, vol. 9, No. 110.

*Primary Examiner*—Donald J. Yusko
*Assistant Examiner*—Edward Merz
*Attorney, Agent, or Firm*—Pasquale Musacchio; Jerry A. Miller

[57] ABSTRACT

A remote control device controls an electronic system that has a number of functions. The remote control device has a limited number of function keys, and certain keys correspond to different functions of the electronic system. In order to permit discrimination of the function keys, the length of time during which the function key is actuated is employed in the electronic system. To prevent erroneous control caused by artificial interruption of the control signal, the remote control device appends one of two different time code signals to the key code corresponding to the actuated function key, whereby discrimination of the actuation time at the electronic system is made possible.

7 Claims, 7 Drawing Sheets

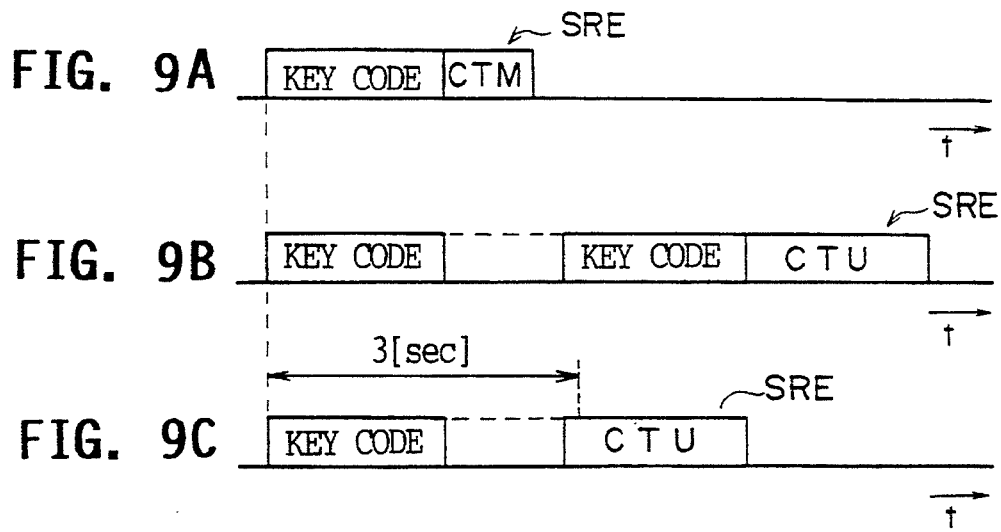
FIG. 9A
FIG. 9B
FIG. 9C
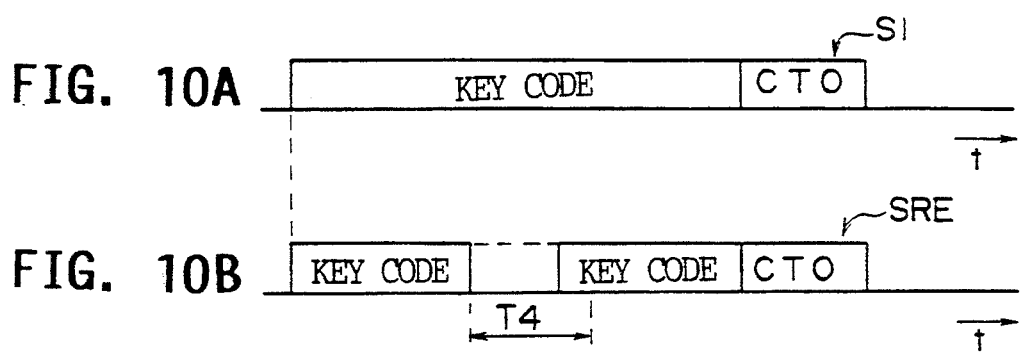
FIG. 10A
FIG. 10B
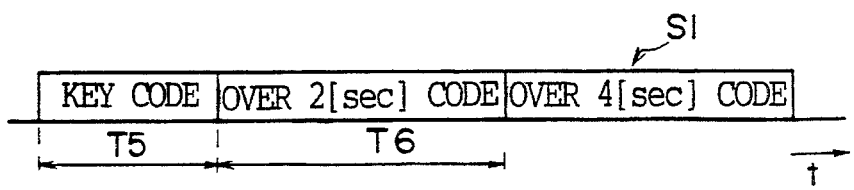
FIG. 11

REMOTE CONTROL DEVICE THAT TRANSMITS SIGNALS INDICATING TERMINATION OF KEY PRESSING OPERATIONS

This is a continuation of application Ser. No. 07/885,085 filed on May 18, 1992 which is abandoned.

BACKGROUND OF THE INVENTION

This invention relates to a remote control device and more particularly to an audio system for cars.

In conventional audio systems for cars, there are some systems which are capable of playing a plurality of compact discs selectively.

For example, in this type of audio system, the plurality of compact discs are stored in the predetermined magazine, and the magazine is integrated with the compact disc player which is placed in the trunk room.

Thus, regarding said audio system, the desired compact discs can be selected and played remotely operating the compact disc player by operating a switch key on the dashboard.

In regards to this type of car audio system, it is considered convenient if audio appliances, such as compact disc player, cassette tape recorder, and visual appliances, such as television receiver, can be turned on at will.

In such a case, if overall function of the audio system can be remotely controlled by using remote commander, e.g., a fellow passenger on the back seat can operate the audio system, it is considered very convenient.

However, if various audio and visual appliances are connected, the construction of remote commander becomes larger sized as well as number of operation keys are increased.

One of the methods to solve the above problem is that the pressing time of the operation key can be detected by detecting the running time of the remote control signals to be outputted from the remote commander and the motion can be shifted according to said pressing time.

Using this method, several shifting functions can be assigned to one operation key and the remote commander can be smaller sized accordingly.

However, this method has disadvantages. A disadvantage is that the remote control signal transmitted from the remote commander to the audio system may be interrupted by an obstruction positioned between the remote commander and the audio system. As such, reception of the remote control signal by the audio system is interrupted, resulting in erroneous operation of the audio system. By way of example, this may occur in a car having front and rear seat passengers, wherein a rear seat passenger utilizes the remote commander to transmit a desired remote control signal which is subsequently interrupted by the body of a front seat passenger. In addition, a further disadvantage is that since the actuation of many functions of the audio system is dependent upon the amount of time that an operation key is activated, the response time for activating these functions is undesirably increased.

SUMMARY OF THE INVENTION

In view of the foregoing, an object of this invention is to provide a remote control device capable of solving the above problems.

The foregoing object and other objects of the invention have been achieved by the provision of a remote control unit 46 (FIG. 3) which outputs remote control signal S1 (FIG. 5) to the prescribed control object 1 corresponding to the operation keys 62 to 68 (FIG. 4), operation time of operation keys 62 to 68 (FIG. 4) is detected and depending on the detected result, and remote control signal S1 (FIG. 5) is formed marking operation time information CTM FIG. 7A), CTU (FIG. 7B), on the code of operation keys 62 to 68 (FIG. 4).

Further, regarding the second concept, in the header 2 (FIG. 1), which receives remote control signal S1 (FIG. 5) outputted from the remote control unit 46 (FIG. 3), and shifts the motion according to the result received, remote control signal S1 (FIG. 5) is formed by the code data of the operation key and operation time information CTM (FIG. 7A), CTU (FIG. 7B) of the operation key and shifts the function according to the code data and operation time information CTM (FIG. 7A), CTU (FIG. 7B).

As such, utilization of the CTM (FIG. 7A) and CTU (FIG. 7B) codes enables the operation keys of the remote commander to control more than one function of the audio system. This enables a reduction in the total number of operation keys, resulting in a corresponding reduction in the overall size of the remote commander. Furthermore, upon reception of the CTM (FIG. 7A) or CTU (FIG. 7B) codes by the audio system, operation of the audio system is subsequently not affected if the remote control signal is interrupted and not received by the audio system.

The nature, principle and utility of the invention will become more apparent from the following detailed description when read in conjunction with the accompanying drawings in which like parts are designated by like reference numerals or characters.

BRIEF DESCRIPTION OF THE DRAWINGS

In the accompanying drawings:

FIGS. 9A to 9C are signal waveform charts illustrating receiving signals;

FIGS. 10A and 10B are signal waveform charts illustrating remote control signals and receiving signals as the other embodiments; and FIG. 11 is a signal waveform chart illustrating remote control signals in case of detecting the pressing time in two steps.

DETAILED DESCRIPTION OF THE INVENTION

Preferred embodiments of this invention will be described with reference to the accompanying drawings:

General Construction

Figure 1:
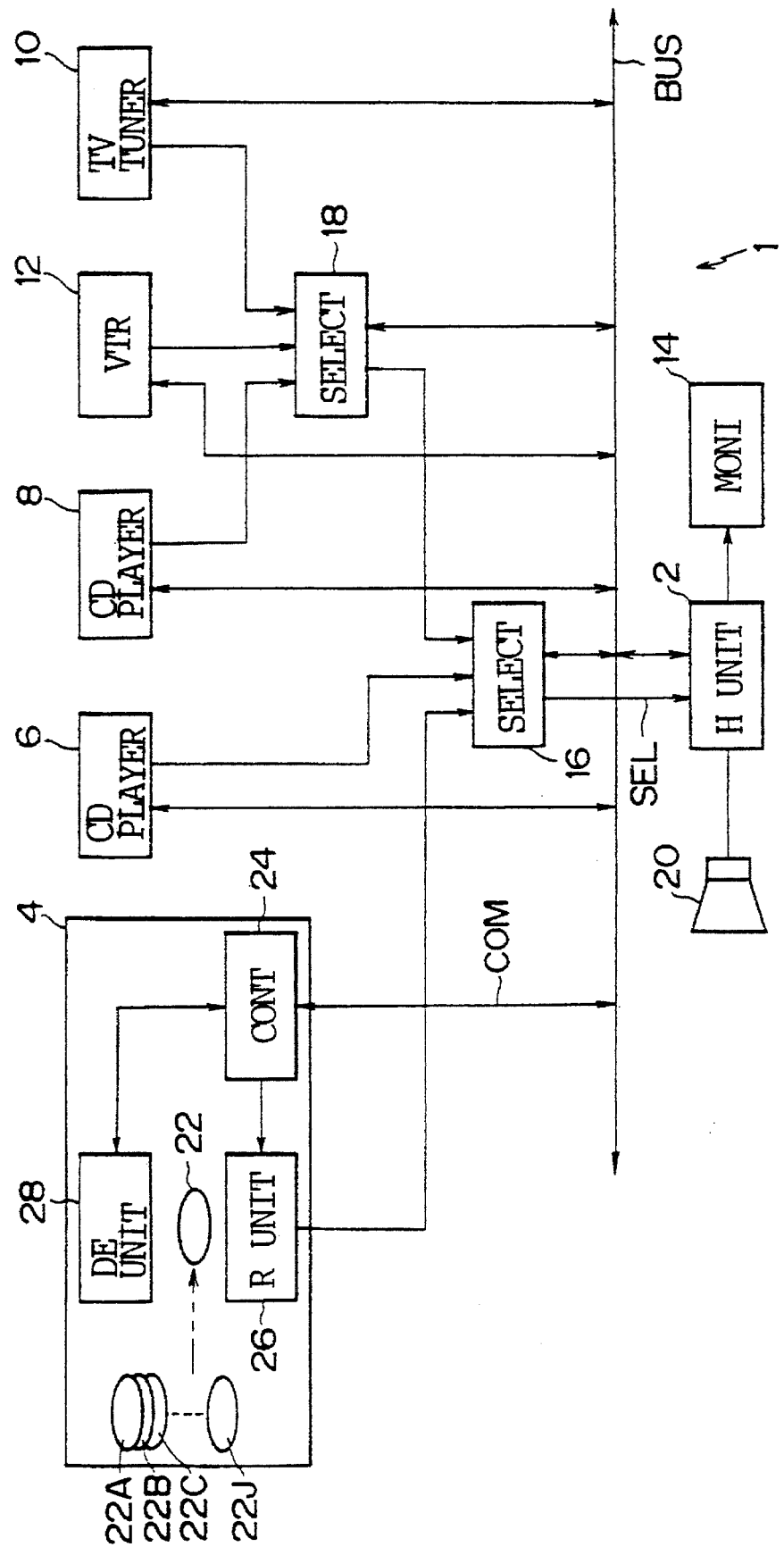
FIG. 1 is a block diagram illustrating an audio system according to one embodiment of the present invention.

Designated generally at numeral I in FIG. 1 is a car audio system, and e.g., compact disc players 4, 6, 8 can be remotely operated by handling the header unit 2 placed in the console panel.

In the audio system 1, compact disc players 4, 6, 8 and television tuner (TV tuner) 10 are placed in the trunk room and video tape recorder (VTR) 12 and monitor unit 14 can be arranged in the console panel.

Further, in the audio system 1, the compact disc players 4, 6, 8, television tuner 10 and header unit 2 are connected via the serial bus BUS and the operation of compact disc players 4, 6, 8, television tuner 10, and video tape recorder 12 can be controlled by the header unit 2 transmitting the control data through the serial bus BUS.

Moreover, in the audio system 1, the compact disc players 4, 6, 8, television tuner 10, video tape recorder 12 and the header unit 2 are connected to each other via selectors 16 and 18, thus selection signals of the selectors 16 and 18 are inputted to the header unit 2.

The control data can be inputted and outputted between each selector 16 and 18 and the header unit 2 via the serial bus BUS. Thus the function can be switched over according to said control data.

In the audio system 1, visual signals of television tuner 10 and video tape recorder 12 can be monitored using the monitor unit 14 upon activating the selection signals of selectors 16 and 18 by utilizing header unit 2.

Further, regarding the audio system 1, audio signals of television tuner 10 and video tape recorder 12 can be monitored using a speaker 20 and also the output signal of the compact disc players 4, 6 and 8 can be monitored by activating selectors 16 and 18.

Here each selector is capable of selecting and outputting 3 input signals. Thus, in the audio system 1, a plurality of terminal units can be connected by adding selectors and shifting connections.

Therefore, users can enjoy music and television broadcasting by shifting connections of terminal units as they desire.

Then in the compact disc players, 4, 6 and 8, compact discs 22A, to 22J can be stored in the magazine, and the compact discs 22A to 22J can be played back selectively according to the control data COM to be inputted via the serial bus BUS.

In the compact disc players 4, 6 and 8, the control data COM is inputted in the microcomputer constructed control circuit 24, and the control circuit 24 controls the reproduction unit 26 and the disc exchange unit 28.

The disc exchange unit 28 serves to transport a selected compact disc 22A to 22J from a storage position within the magazine to a playback position within the reproduction unit 26 in accordance with the output signal from the control unit 24. The reproduction unit 26 serves to playback a selected compact disc 22A to 22J placed in the playback position by energizing an optical pickup (not shown). Upon completion of playback, the disc exchange unit 28 transports the selected compact disc 22A to 22J from the playback position back to the storage position within the magazine. Thus, header unit 2 may be utilized to control the operation of compact disc players 4, 6 and 8 in order to playback a desired compact disc 22A to 22J.

Furthermore, each compact disc player 4, 6 or 8 outputs the recognition data of reproducing compact disc 22 and truck data via the serial bus BUS, and thus the function of each compact disc player 4, 6 or 8, can be recognized in the header unit 2.

Also in the television tuner 10, a built-in control circuit receives the control data COM and the function is shifted in accordance with said control data COM.

Thus, in the television tuner 10, the television broadcasting which the user requests is chosen as well as the visual signal and audio signal of said television broadcasting are outputted.

Regarding the video tape recorder, the operation mode is shifted according to the control data COM to be inputted in the built-in control circuit and thus the video tape set by the user can be reproduced.

Header Unit Construction

Figure 2:
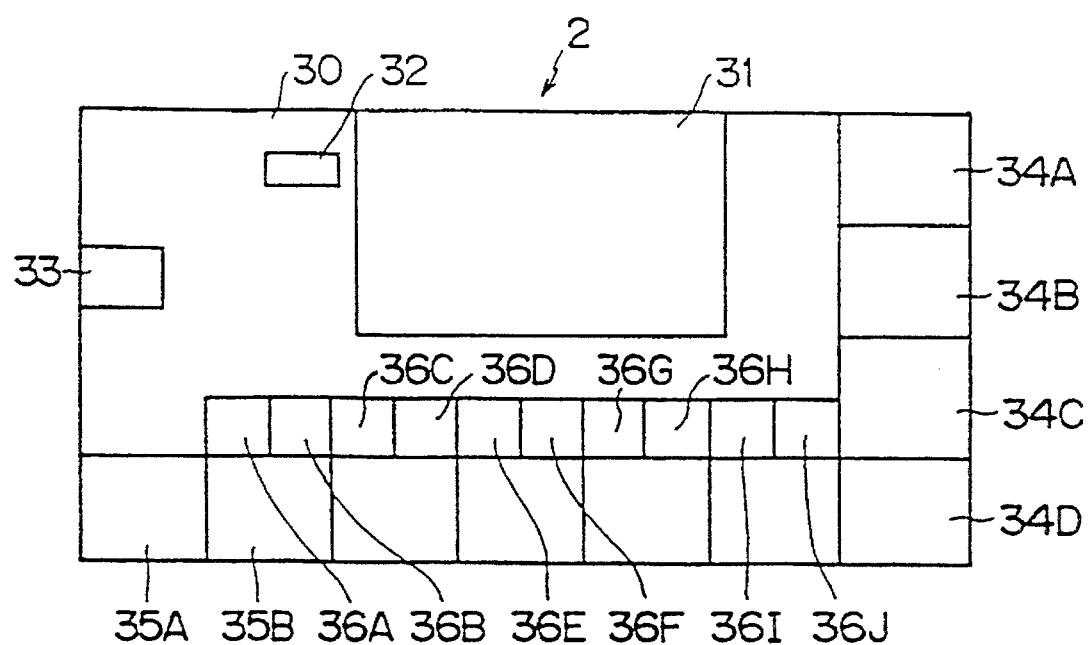
FIG. 2 is a front view illustrating a front panel of a header unit.

As shown in FIG. 2, in the header unit 2, the display unit 31 is arranged on the front panel 30, and display of the display unit 31 can be shifted by operating the operation key for switching the display mode 32; e.g., the present time can be displayed.

On the front panel 30, while the electric power switch 33 is placed on the left end, operation keys for sound volume 35A and 35B are set on the lower part and terminal appliance operation keys 34A to 34D for selecting the terminal appliances are located on the right side of the panel. Thus the usability can be outstandingly improved since the operation keys of the same category are placed together.

Further, in the front panel 30, the operation keys for switching the operation mode 36A to 36J are placed near the sound volume operation keys 35A and 35B and overall operation mode of the audio system 1 can be switched by shifting the operation keys 36A to 36J.

Figure 3:
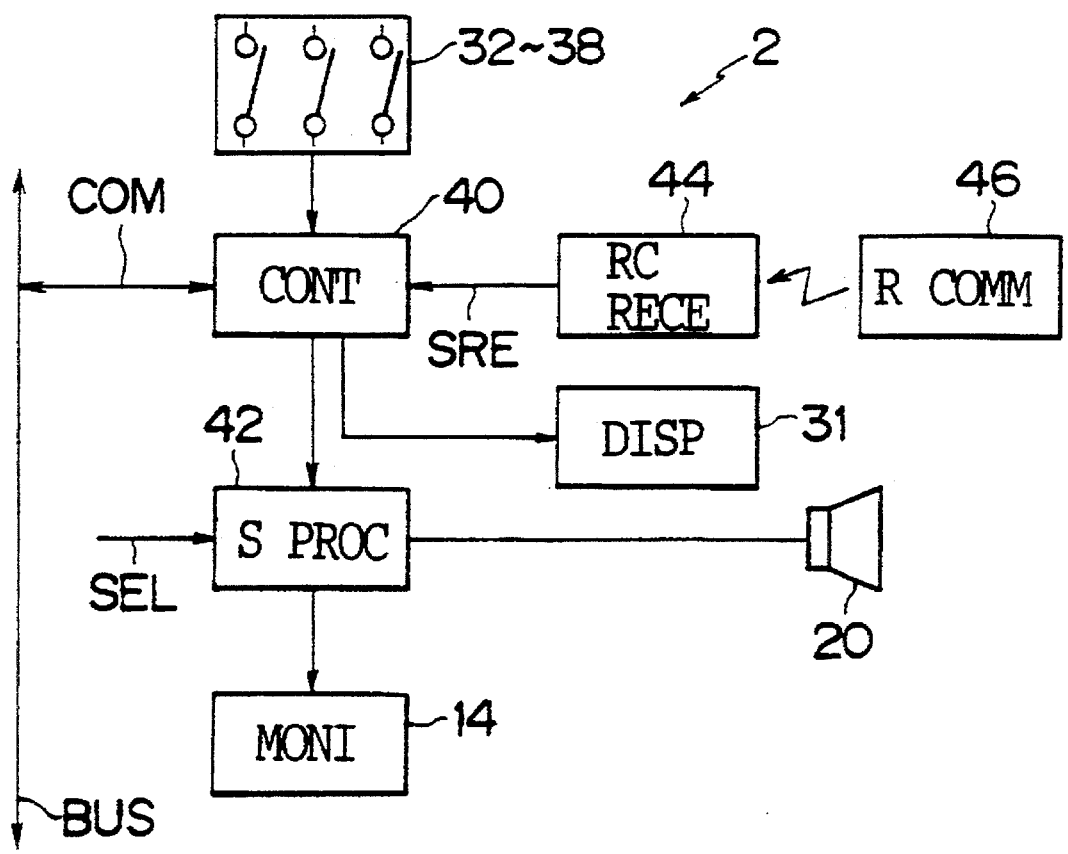
FIG. 3 is a block diagram illustrating a header unit.

As shown in FIG. 3, the header unit 2 contains microcomputer constructed control circuit 40, and the control circuit 40 outputs control data corresponding to the operation of the operation keys 32 to 38.

Then, the control circuit 40 outputs the control data to the signal processing circuit 42 when the sound volume operation keys 35A and 35B are operated and the function of said signal processing circuit 42 is switched over.

Hence, the signal processing circuit 42 inputs the selective signal SEL to be inputted via selectors 16 and 18, and a function is selected according to the selection signals of selectors 16 and 18.

In a case when said compact disc players 4, 6 and 8 are selected, the signal processing circuit 42, after amplifying the audio signal to be outputted from the compact disc players 4, 6 and 8, outputs to the speaker 20.

At this moment, the signal processing circuit 42 shifts quality and volume of sound corresponding to the output data of the control circuit 40.

On the other hand, when the television tuner 10 or video tape recorder 12 is selected, the signal processing circuit 42 outputs audio signal to be outputted from said television tuner 10 or video tape recorder 12 to the speaker 20, and also outputs it to the monitor unit 14 after signal processed visual signal.

Thus, the signal processing circuit 42 is able to monitor the audio signal and visual signal, on the condition the user desires.

When the operation key 32 for switching display mode is operated, the control circuit 40 controls the display unit 31 by switching the display, and thus in said header unit 2, the present time can be recognized via the display unit 31.

At this time, the control circuit 40 outputs the control data to the signal processing circuit 42 corresponding to the user's operation. And thus, the present time can be recognized via the monitor unit 14.

Further, if terminal appliance operation keys 34A to 34D are operated, the control data COM is outputted to the serial bus BUS and terminal appliances 4–18 connected to serial bus BUS are selected. In addition, the functions of the audio system 1 can be selected by and controlled by operating the remote commander 46.

The header unit 2, after receiving the remote control signal of the remote commander 46 in the remote control receiver 44, outputs the receiving signal SRE to the control circuit 40.

The control circuit 40 outputs the control data according to the said receiving signal SRE as well as the operation keys 32 to 38 are operated, and thus the functions of the audio system 1 can be selected according to the operation of the remote commander 46.

Remote Commander

Figure 4:
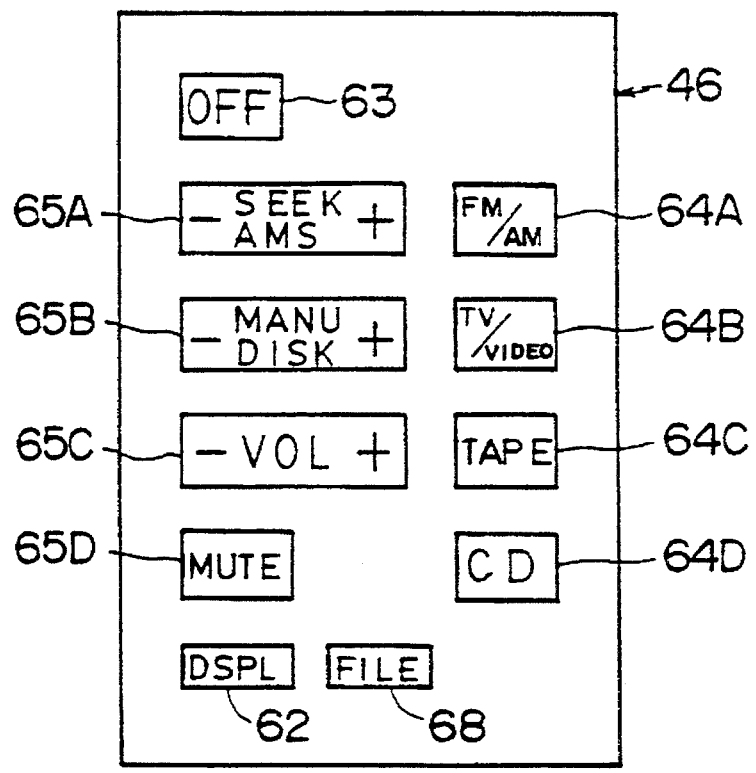
FIG. 4 is a plane view illustrating a remote commander.

As shown in FIG. 4, the remote commander 46 includes operation keys 62 to 68. Operation keys 62 to 68 may be utilized to select each function of the audio system 1. It is noted that operation keys 62 to 68 may be used to select the same functions of the audio system 1 which may be selected by using front panel operation keys 32 to 38. As such, either the remote commander 46 operation keys or the front panel operation keys may be used to operate the audio system 1.

The electric power source operation key 63 is placed on top of the remote commander 46, and in said audio system 1, the electric power can be on/off controlled by operating the said operation key 63 or the front panel operation key 33.

In the remote commander 46, the operation keys 65A to 65D for sound volume, etc. are located below operation key 63 and in the audio system 1, the operation of signal processing circuit 42 can be changed by operating said operation keys 65A to 65D or front panel operation keys 35A to 35D.

Furthermore, on the right hand side of the remote commander 46, the operation keys 64A to 64D for switching terminal unit are placed corresponding to the front panel operation keys 34A tO 34D. And the operation key 62 for switching display, and the file display operation key 68 are placed on the lower part corresponding to the front panel operation key 32 and the file display operation key 38.

Figure 5:
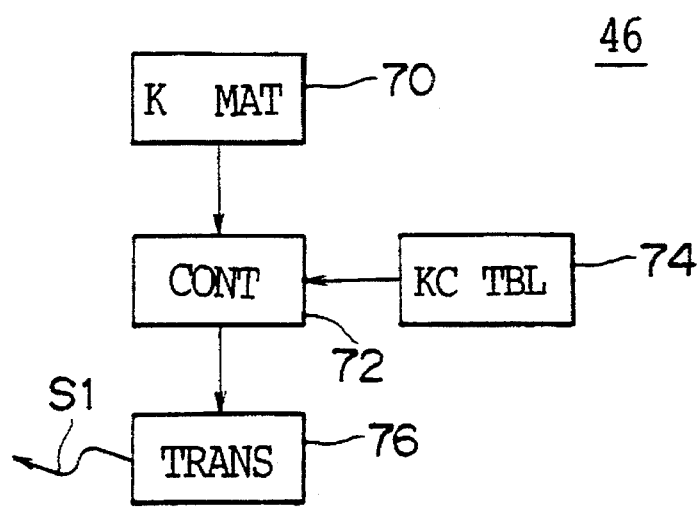
FIG. 5 is a block diagram illustrating a remote commander.

As shown in FIG. 5, in the remote commander 46 activation of the operation keys 62 to 68 is detected via key matrix 70 at the control circuit 72, and the control circuit 72 gains access to the key code table 74 depending on the detected result thereof.

Therefore, in regard to the remote commander 46, a prescribed key code corresponding to an activated operation key 62 to 68 is transmitted to the transmitting unit 76. The transmitting unit 76 then outputs a remote control signal S1.

Figure 6:
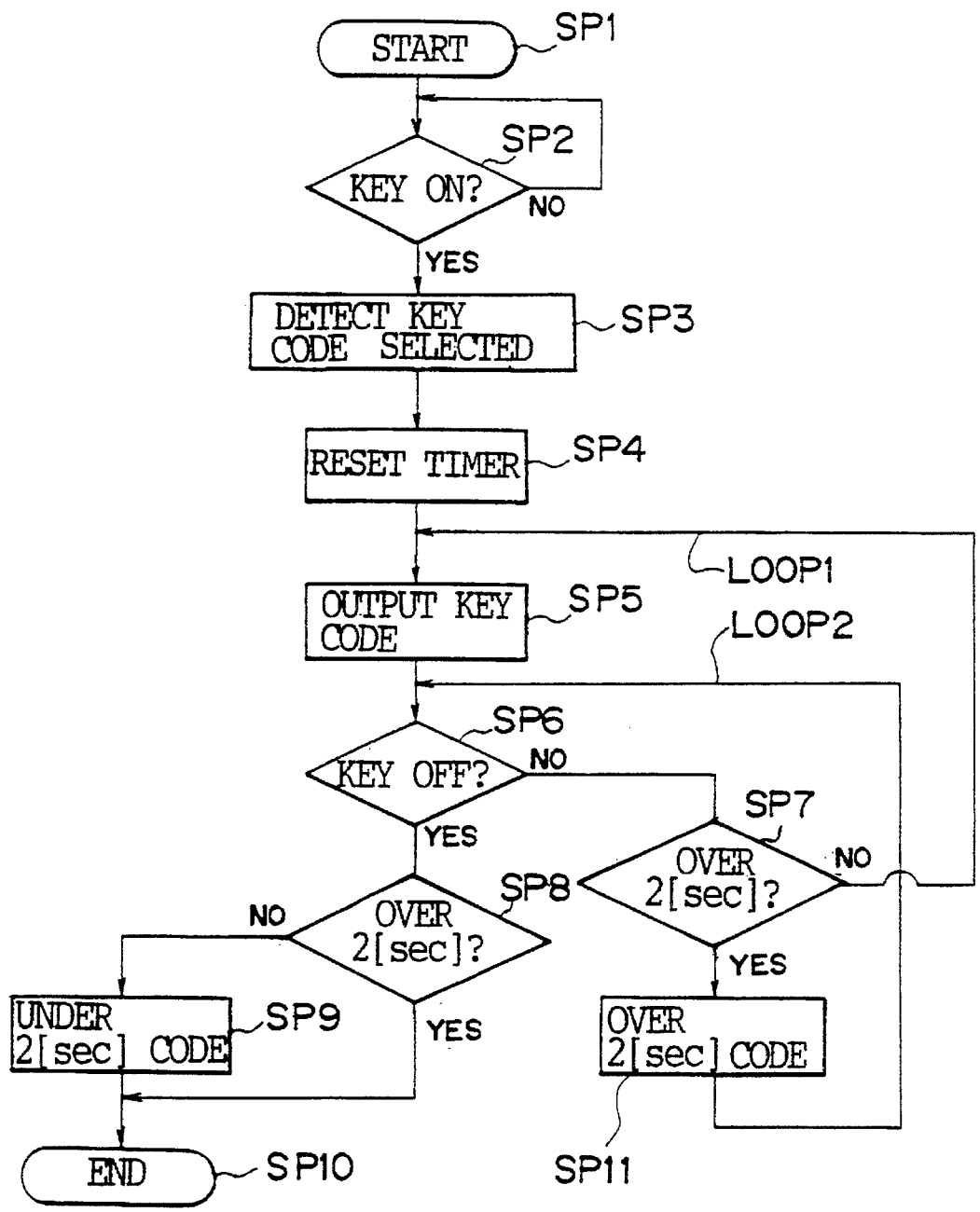
FIG. 6 is a flow chart illustrating processing of the control circuit.

At this time, in the control circuit 72, pressing time of the operation key is detected by carrying out the process as shown in FIG. 6 and depending on the detected result, the remote control signal S1 is formed.

Next the control circuit 72 moves from step SP1 to step SP2 and judges whether the operation keys 62 to 68 are pressed or not, and if negative result is obtained, repeats step SP2.

Then the control circuit 72 repeats step SP2 and when the operation keys 62 to 68 are pressed, moves to step SP3.

Here the control circuit 72 detects which operation keys 62 to 68 have been activated and depending on the detection result, refers to the key code table 74 and detects the key code of the operation key activated.

Then the control circuit 72 moves to step SP4, and here after resetting the built-in timer, moves to step SP5, and outputs key code detected to the transmitting unit 76.

Hence after transmitting remote control signal S1 the control circuit 72 moves to step SP6 and judges whether activation of the operation keys 62 to 68 has been completed or not.

In a case when the operation key 62 to 68 is left pressed, the control circuit 72 obtains negative result and moves to step SP7, and judges whether timer has exceeded 2 [sec] or not.

In this case the control circuit 72 moves to step SP5 if negative result is obtained, and outputs the key code detected to the transmitting unit again.

Figure 7A:
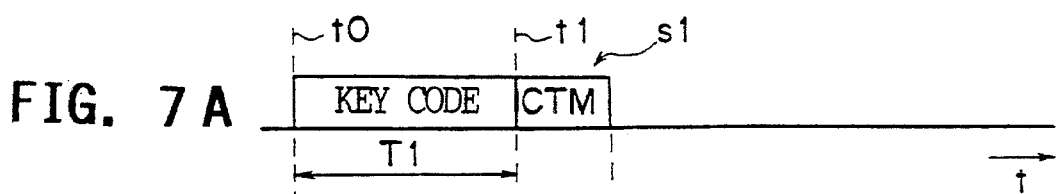
FIGS. 7A and 7B are signal waveform charts illustrating difference in remote control signals caused by pressing time.
Figure 7B:
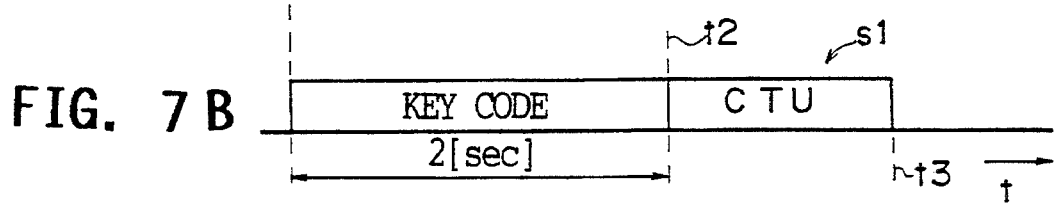

As shown in FIG. 7, in the remote commander 46, the control circuit 72 repeats the looping LOOP1, step SP5–SP6–SP7–SP5, and if the operation key 62 to 68 is at the time point t0, outputs remote control signal S1 formed by the repetition of key code, until an operation key 62–68 has been activated for more than 2 [sec] (FIGS. 7A and 7B).

On the other hand, if activation of the operation keys 62 to 68 is completed within 2 [sec], the control circuit 72 obtains positive result at the step SP6, and moves toward the step SP8, and again judges whether activation has exceeded 2 [sec] or not. And if negative result is obtained, moves to the step SP9.

Hence, the control circuit 72 after outputting the code CTM, which shows that activation is under 2 [sec], to the transmitting unit 76 for the predetermined number of times, moves to the step SP10, and the process is completed.

Thus, in the remote control signal S1, if activation is under 2 [sec], under 2 second code CTM continues after key code continues during the period T1, from a point of time t0 to a point of time t1, activation of the operation key is completed (FIG. 7A).

On the other hand, if activation on an operation key 62–68 exceeds 2 [sec], the positive result can be obtained at the step SP7, then the control circuit 72 moves to the step SP11.

Then, the control circuit 72 outputs the code to show that activation is over 2 [sec] (hereinafter referred to as over 2 [sec] code) CTU to the transmitting unit 74 and returns to the step SP6.

Then in the control circuit 72, if activation exceeds 2 [sec], the loop LOOP2 of step SP6–SP7–SP11– SP6 is repeated in place of the loop LOOP1, and when activation is completed, the positive result is obtained at the step SP6, and moves to the step SP8.

And the control circuit 72, because of positive result, moves to the step SP10 directly and completes the procedure.

Then the remote control signal S1, in a case when activation exceeds 2 [sec], after the key code continues for 2 [sec], over 2 [sec] code CTU is outputted continuously during the period from the time t2 to the time t3, activation is completed (FIG. 7B).

Therefore, at the control circuit 40 on the receiving side, the operation key activated according to the key code can be detected. On the other hand, the activation of operation key can be detected in accordance with the under 2 [sec] code CTM and/or over 2 [sec] code CTU marked on the key code.

At this moment, in this embodiment, the control circuit 40 is able to detect repeatedly the same key code, and under 2 [sec] code CTM and over 2 [sec] code CTU by repeating the loop LOOP1 and LOOP2.

Therefore, in a case if the remote control signal S1 is intercepted and received intermittently, the activation key operated and operation time can be securely detected, and thus the function error of the audio system 1 can be avoided in advance.

Figure 8A:
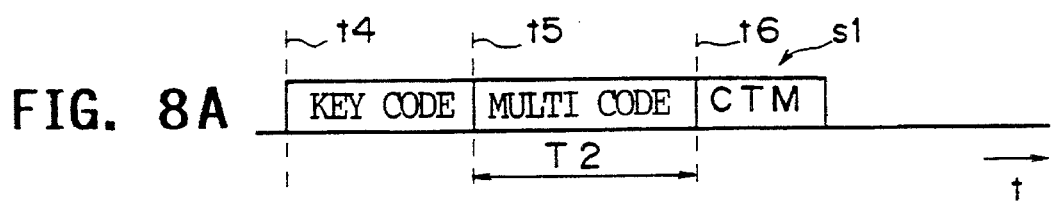
FIGS. 8A and 8B are signal waveform charts illustrating a case of multiple pressing.
Figure 8B:
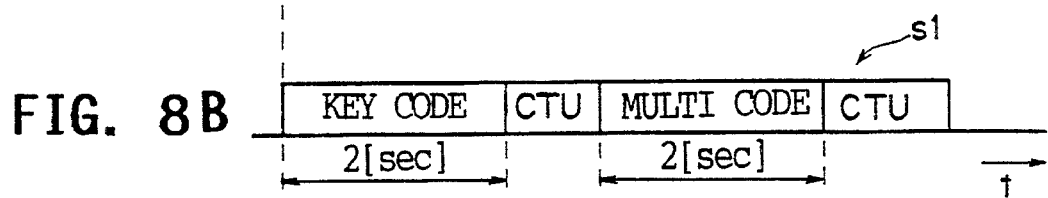

Similarly, in the control circuit 72, if one of the operation keys 62 to 68 is activated, as shown in FIGS. 8A and 8B, the remote control signal S1 is outputted and thus the function can be selected by operating 2 operation keys.

For example, if one of the operation keys 62 to 68 is activated at a point of time t4 and then one of the other operation keys 62 to 68 is activated at a point of time t5, the control circuit 72 firstly outputs the key code of operation key 62 to 68 activated during the period from a point of time t4 to a point of time t5 (FIG. 8A).

If two operation keys are operated almost simultaneously and period of time from the time point t4 to time point t5 is short, the remote control circuit 72 outputs key codes of 2 operation keys 62 to 68 operated (the key codes of this case referred to as multiple code) from the time point t5 when the second operation key 62 to 68 is activated.

Under this condition, during the period in which 2 operation keys 62 to 68 are simultaneously activated, the control circuit 72 outputs multiple code continuously, and activated of a key is completed, 2 [sec] code CTM is outputted, provided the period T2, 2 keys are activated simultaneously, is under 2 [sec].

On the contrary, after 2 [sec], if two operation keys are still being activated simultaneously, then after 2 [sec], over 2 [sec] code CTU is outputted converting multiple code.

Thus in the control circuit 40 of the receiving side, the function of the prescribed audio system 1 can be switched as desired even if the remote control signal S1 is intercepted.

Further, when operation keys of the remote commander 46 are operated simultaneously, and if one operation key is activated earlier by mistake, the operation error of the audio system I can be avoided in advance.

On the other hand, in a case when the second operation key is activated after the elapse of prescribed period on condition that the first operation key is left activated, the control circuit 72 outputs the key code of said operation key for 2 [sec] from the time point t4, and then outputs over 2 [sec] code CTU to the time point t8, the second operation key is activated. (FIG. 8B).

Further, the control circuit 72 outputs the multiple code from the time point t8 and if the period in which two operation keys 62 to 68 are being simultaneously pressed is under 2 [sec], outputs under 2 [sec] code CTM. And if the prescribed period is over 2 [sec], outputs over 2 [sec] code CTU after the elapse of 2 [sec].

Regarding the audio system 1, in a case when a function is selected by operating 2 operation keys simultaneously, function of the operation key can be changed over according to the length of time the operation key is activated.

Regarding the remote commander 46, various controls can be executed with the limited number of operation keys 62 to 68, and thus the usability of the audio system can be advanced.

As shown in FIGS. 9A to 9C, in the control circuit 40, the key code received at first and the time information, i.e., over 2 [sec] code or under 2 [sec] code, received are detected (FIG. 9A), and output the control data COM as occasion demands.

At this point, in the control circuit 40, as the result the remote signal S1 is intercepted, the receiving signal SRE is received to be intercepted on the way (FIG. 9B).

In this case, one condition on which the operation key is pressed continuously and the other condition on which the next operation key is pressed, are considered.

In this embodiment, the control circuit 40 judges as the remote control signal S1 is intercepted for some reason and outputs the control data COM corresponding to the key code and time information received when the time information is detected within 3 [sec] after key code rises (FIG. 9C).

Thus, in the control circuit 40, even if the remote control signal S1 is intercepted, operation error can be avoided effectively.

Further, in the control circuit 40, concerning the key code and time information to be transmitted repeatedly, if each one of these can be received, the content of the remote control signal S1 can be detected.

Accordingly, the responding time can be effectively shortened, thus the usability of the audio system can be improved.

Thus, in the control circuit 40, for example, when the key code and under 2 [sec] code are received, function of compact disc players 4, 6 and 8 are switched. On the other hand, when the key code and over 2 [sec] code are received, function of the audio system 1 is switched over to the mode which has comparatively low frequency in switching (consisting of modes, such as to register the title of compact disc).

In the control circuit 40, if the multiple code is added, the function with lower frequency will be switched (such as switching of background color of display 31).

Hence, in the control circuit 40, even if many operation keys 62 to 68 are not included in the remote commander 46, various functions can be switched over and thus the usability of said audio system 1 will improved.

Effects of the Embodiments

According to the construction discussed above, even if the control signals are intercepted, the function can be switched over with certainty by marking operation time information on the key code of the operation key and forming remote control signals.

Therefore, the function of each operation key can be switched over in accordance with operation time of the operation key, and the construction of remote commander can be simplified accordingly.

Other Embodiments

The embodiment discussed above has dealt with the transmittal of pressing time information after judgment has been made whether the operation key is pressed over 2 [sec] or not. The present invention is not, however, limited to this device. As shown in FIGS. 10A and 10B, by marking key OFF information CTO to show the operation of operation key is done at the end of key code, operation time information can be transmitted using this key OFF information CTO.

Thus, when the receiving signal SRE is stopped on the receiving side, and if key code and time information are received within the designated time T4 (e.g., the period of several hundred [msec]), the function can be switched over judging the remote control signal S1 is intercepted for some reason and thus the function error of the audio system 1 can be effectively avoided.

Furthermore, the embodiment discussed above has dealt with the case of judging whether the activation time is over 2 [sec] or not. The present invention is not limited to this. As shown in FIG. 11, in addition to over 2 [sec] or not, time information can be outputted in accordance with the result of judgment if the key is pressed over 4 [sec] or not.

Moreover, the embodiment discussed above has dealt with the case of judging the activation time by dividing at 2 [sec] intervals. However, the present invention is not only limited to this device, but also applicable to the case of dividing at various time intervals.

Further, the embodiment discussed above has dealt with the case of detecting the activation time of operation key. The present invention is not, however, only limited to this, but also widely applicable to the cases of detecting the activation time of operation key and outputting time information.

Moreover, the embodiment discussed above has dealt with the case of connecting 3 sets of compact disc player, video tape recorder and television tuner. The present invention is not only limited to this, but also applicable widely to the cases of connecting several compact disc players, and also connecting cassette tape recorder and navigation systems as occasion demands.

Further, the embodiment discussed above has dealt with the case or remotely controlling the audio systems placed in the car. The present invention is not, however, only limited to this device, but also applicable widely to the case of remotely controlling various electronic appliances.

According to the present invention as described above, it is possible to attain the remote control device which is capable of controlling the control object by detecting the operation time of the operation key and forming the remote control signals with information of the operation key code and operation time, even if the remote control signals are intercepted.

While there has been described in connection with the preferred embodiments of the invention, it will be obvious to those skilled in the art that various changes and modifications may be made therein without departing from the invention, and it is aimed, therefore, to cover in the appended claims all such changes and modifications as fall within the true spirit and scope of the invention.

What is claimed is:

1. A remote control device for transmitting a control signal to activate a selected function of an electronic system having a plurality of functions, comprising:

at least one selecting means for activation by a user and each associated with at least two of said functions generating means for determining a key code signal corresponding to an activated one of said selecting means;

control means for determining whether an activation period of said activated one of said selecting means is greater or less than a predetermined time period and for appending a first time code signal to said key code signal when said activation period is less than said predetermined time period, and for appending a second time code signal to said key code signal when said activation period is greater than said predetermined time period, wherein said first time code signal and said key code signal form a first remote control signal and said second time code signal and said key code signal form a second remote control signal; and transmitting means for transmitting either said first or second remote control signals for controlling said electronic system.

2. The remote control device according to claim 1, wherein said predetermined time period is two seconds.

3. The remote control device according to claim 1, wherein said electronic system includes a display means for indicating which of said functions is activated.

4. The remote control device according to claim 1, wherein said electronic system is an audio system.

5. A method of remote control of an electronic system having a plurality of functions, comprising the steps of:

activating one of a plurality of function keys to select one of said functions;

generating a key code signal corresponding to the activated one of said function keys;

determining whether the activated one of said function keys is activated less than a predetermined time period;

generating a first time code signal when said function key is determined to be activated less than said predetermined time period and appending said first time code signal to said key code signal;

determining whether the activated one of said function keys is activated for a time greater than said predetermined time period;

generating a second time code signal when said function key is determined to be activated greater than said predetermined time period and appending said second time code signal to said key code signal, wherein said key code signal and said first time code signal form a first remote control signal and said key code signal and said second time code signal form a second remote control signal; and transmitting either said first remote control signal or said second remote control signal to said electronic system for activating said desired function.

6. The method according to claim 5 wherein said predetermined time period is 2 seconds.

7. The method according to claim 5 further including the step of indicating which of said functions is activated on a display screen.

* * * * *